United States Patent
Guo (10) Patent No.: US 9,741,929 B2
(45) Date of Patent: Aug. 22, 2017

(54) METHOD OF MAKING A SPIN-TRANSFER-TORQUE MAGNETORESISTIVE RANDOM ACCESS MEMORY (STT-MRAM)

(71) Applicant: Yimin Guo, San Jose, CA (US)

(72) Inventor: Yimin Guo, San Jose, CA (US)

(73) Assignee: T3Memory, Inc., Saratoga, CA (US)

( * ) Notice: Subject to any disclaimer, the term of this patent is extended or adjusted under 35 U.S.C. 154(b) by 0 days.

(21) Appl. No.: 14/710,616

(22) Filed: May 13, 2015

(65) Prior Publication Data

US 2016/0336508 A1    Nov. 17, 2016

(51) Int. Cl.
| | | |
|---|---|---|
| H01L 21/00 | (2006.01) | |
| H01L 43/12 | (2006.01) | |
| H01L 43/02 | (2006.01) | |
| H01L 43/08 | (2006.01) | |
| H01L 43/10 | (2006.01) | |
| H01L 27/22 | (2006.01) | |

(52) U.S. Cl.
CPC ............ H01L 43/12 (2013.01); H01L 27/226 (2013.01); H01L 43/02 (2013.01); H01L 43/08 (2013.01); H01L 43/10 (2013.01)

(58) Field of Classification Search
CPC ..................................................... H01L 43/12
USPC ........................................................... 438/3
See application file for complete search history.

(56) References Cited

U.S. PATENT DOCUMENTS

| | | | | |
|---|---|---|---|---|
| 2009/0078927 A1* | 3/2009 | Xiao | ........................ | H01L 43/12 257/9 |
| 2009/0246557 A1* | 10/2009 | Horng | ................... | G01R 33/098 428/811.1 |
| 2009/0256220 A1* | 10/2009 | Horng | ...................... | H01L 43/08 257/421 |
| 2010/0311243 A1* | 12/2010 | Mao | ....................... | H01L 27/222 438/694 |
| 2013/0175644 A1* | 7/2013 | Horng | ..................... | H01L 43/12 257/421 |

* cited by examiner

*Primary Examiner* — Matthew Landau
*Assistant Examiner* — Igwe U Anya
(74) *Attorney, Agent, or Firm* — 5Suns; Lance A. Li; Chein-Hwa Tsao (57) ABSTRACT

A method of making a novel STT-MRAM is disclosed, wherein the STT-MRAM comprises a novel apparatus along with a method of operating a spin-torque magnetoresistive memory and a plurality of magnetoresistive memory elements having spin-transfer torques acting on a recording layer from a MTJ stack and a novel magnetoresistance with a spin-valve layer. The spin-valve layer is field-reversible between two stable magnetization states either parallel or anti-parallel to the fixed reference layer magnetization through a set/reset current pulse along a conductive line provided by a control circuitry, accordingly, the magetoresistive element is pre-configured into a reading mode having canceled spin-transfer torques or a recording mode having additive spin-transfer torques.

18 Claims, 7 Drawing Sheets

Figure 1. Present Invention

Figure 2A. Present Invention

Figure 2B. Present Invention

Figure 3A. Present Invention

Figure 3B. Present Invention

Figure 4. Present Invention

Figure 5. Present Invention

Figure 6
Present Invention

Figure 7
Present Invention

Figure 8. Present Invention

Figure 9. Present Invention

Figure 10. Present Invention

Figure 11. Present Invention

Figure 12. Present Invention

Figure 13A
Present Invention

Figure 13B
Present Invention

Figure 14. Present Invention

Figure 15. Present Invention

Figure 16. Present Invention

Figure 17. Present Invention

Figure 18. Present Invention

Figure 19. Present Invention

Figure 20. Present Invention

METHOD OF MAKING A SPIN-TRANSFER-TORQUE MAGNETORESISTIVE RANDOM ACCESS MEMORY (STT-MRAM)

RELATED APPLICATIONS

This application is a divisional application on application Ser. No. 14/147,493. This application seeks priority to U.S. Utility patent application Ser. No. 14/147,493 filed on Jan. 3, 2014 and U.S. Provisional Patent Application No. 61/749,256 filed on Jan. 5, 2013; the entire contents of each of which are incorporated herein by reference.

1. FIELD OF THE INVENTION

This invention relates generally to a spin-transfer-torque magnetic-random-access memory (MRAM) and a method of manufacturing the same using magnetoresistive elements as basic memory cells, more particularly to structures and methods of reading and programming a spin-torque magnetoresistive random access memory (MRAM) having a field-control spin-valve capability.

2. DESCRIPTION OF THE RELATED ART

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can also cope with high-speed reading and writing. A ferromagnetic tunnel junction has a three-layer stack structure formed by stacking a recording layer having a changeable magnetization direction, an insulating tunnel barrier layer, and a fixed layer that is located on the opposite side from the recording layer and maintains a predetermined magnetization direction. Corresponding to the parallel and anti-parallel magnetic states between the recording layer magnetization and the reference layer magnetization, the magnetic memory element has low and high electrical resistance states, respectively. Accordingly, a detection of the resistance allows a magnetoresistive element to provide information stored in the magnetic memory device.

There has been a known technique for achieving a high MR ratio by forming a crystallization acceleration film that accelerates crystallization and is in contact with an interfacial magnetic film having an amorphous structure. As the crystallization acceleration film is formed, crystallization is accelerated from the tunnel barrier layer side, and the interfaces with the tunnel barrier layer and the interfacial magnetic film are matched to each other. By using this technique, a high MR ratio can be achieved.

Typically, MRAM devices are classified by different write methods. A traditional MRAM is a field-switched MRAM utilizing electric line currents to generate magnetic fields and switch the magnetization direction of the recording layer in a magnetoresistive element at their cross-point location during the programming write. A spin-transfer torque (or STT)-MRAM has a different write method utilizing electrons' spin momentum transfer. Specifically, the angular momentum of the spin-polarized electrons is transmitted to the electrons in the magnetic material serving as the magnetic recording layer. According to this method, the magnetization direction of a recording layer is reversed by applying a spin-polarized current to the magnetoresistive element. As the volume of the magnetic layer forming the recording layer is smaller, the injected spin-polarized current to write or switch can be also smaller. Accordingly, this method is expected to be capable of achieving both device miniaturization and lower currents. In another word, STT-MRAM having high speed, large capacities and low-power-consumption operations can potentially replace the conventional semiconductor memory used in electronic chips, especially mobile chips for power saving and non-volatility.

In a simple configuration, the so-called planar STT-MRAM, the recording layer of each MTJ element is designed to have stable magnetic states with magnetization in the film plane. In-plane devices typically have their magnetic easy axis defined by the in-plane shape of the free layer, or the shape anisotropy. To record information or change resistance state, a recording current is provided by its CMOS transistor to flow in the stacked direction of the magnetoresistive element. Generally, constant-voltage recording is used when recording is performed in a memory device accompanied by a resistance change. In a STT-MRAM, the majority of the applied voltage is acting on a thin oxide layer (tunnel barrier layer) which is about 10 angstroms thick, and, if an excessive voltage is applied, the tunnel barrier breaks down. More, even when the tunnel barrier does not immediately break down, if recording operations are repeated, the element may still become non-functional such that the resistance value changes (decreases) and information readout errors increase, making the element un-recordable. Furthermore, recording is not performed unless a sufficient voltage or sufficient spin current is applied. Accordingly, problems with insufficient recording arise before possible tunnel barrier breaks down.

In the mean time, since the switching current requirements reduce with decreasing MTJ element dimensions, STT-MRAM has the potential to scale nicely at even the most advanced technology nodes. However, patterning of small MTJ element leads to increasing variability in MTJ resistance and sustaining relatively high switching current or recording voltage variation in a STT-MRAM.

Reading STT MRAM involves applying a voltage to the MTJ stack to find out whether the MTJ element states are at high resistance or low. However, a relatively high voltage needs to be applied to the MTJ to correctly determine whether its resistance is high or low, and the current passed at this voltage leaves little difference between the read-voltage and the write-voltage. Any fluctuation in the electrical characteristics of individual MTJs at advanced technology nodes could cause what was intended as a read-current, to have the effect of a write-current, thus reversing the direction of magnetization of the recording layer in MTJ.

Thus, it is desirable to provide STT-MRAM structures and methods that realize both highly-accurate reading and highly-reliable recording while suppressing destruction and reduction of life of MTJ memory device due to recording in a nonvolatile memory that performs recording resistance changes.

BRIEF SUMMARY OF THE PRESENT INVENTION

The present invention comprises apparatus and a method provided for programming, recording and reading in a planar STT-MRAM. A plurality of magnetoresistive memory element in a planar STT-MRAM comprises: a recording layer having magnetic anisotropy in a film surface and having a variable magnetization direction; a reference layer having magnetic anisotropy in a film surface and having an invariable magnetization direction; a tunnel barrier layer provided between the recording layer and the reference layer; an intermediate layer provided on a surface of the recording layer, which is opposite to a surface of the recording layer where the tunnel barrier layer is provided; a spin-valve layer provided on a surface of the intermediate layer having magnetic anisotropy in a film plane and having a variable magnetization direction. An upper electrode and a bottom electrode sandwich a magnetoresistive memory element, wherein a bit line coupled to the plurality of magnetoresistive memory elements through the upper electrode and a CMOS transistor coupled the plurality of magnetoresistive memory elements through the bottom electrode.

An exemplary embodiment includes method of operating a spin-torque magnetoresistive memory including a circuitry coupled to the bit line positioned adjacent to the selected ones of the plurality of magnetoresistive memory elements and configured to set the spin-valve layer to a first known magnetic state having a magnetization anti-parallel to the invariable magnetization direction of the reference layer by a magnetic setting field with a predominant component anti-parallel to the invariable magnetization direction of the reference layer when a setting electrical current pulse of predetermined magnitude, duration, and direction flows along the bit line, and to reset the spin-valve layer to a second known magnetic state having a magnetization parallel to the invariable magnetization direction of the reference layer by a magnetic resetting field with a predominant component parallel to the invariable magnetization direction of the reference layer when a setting electrical current pulse of predetermined magnitude, duration, and direction flows along the bit line. After each setting the spin-valve layer to the first magnetic state, the magnetization of the recording layer is configurable, or switchable, to the direction in accordance with a direction of a recording current through the bit line into the stacked body along the stack direction to act on the recording layer by a dual spin-transfer torque from the reference layer and the spin-valve layer. After each resetting the spin-valve layer to the second magnetic state, the magnetization of the recording layer becomes un-configurable, or un-switchable to a reading current through the bit line into the stacked body along the stack direction, since the reference layer and spin-valve layer have parallel magnetizations on the opposite sides of the recording layer and accordingly spin-transfer torques cancel or partially cancel.

Another exemplary embodiment includes method of operating a spin-torque magnetoresistive memory including a circuitry coupled to a conductive set/reset line positioned adjacent to the selected ones of the plurality of magnetoresistive memory elements and configured to set the spin-valve layer to a first known magnetic state having a magnetization anti-parallel to the invariable magnetization direction of the reference layer by a magnetic setting field with a predominant component anti-parallel to the invariable magnetization direction of the reference layer when a setting electrical current pulse of predetermined magnitude, duration, and direction flows along the conductive set/reset line, and to reset the spin-valve layer to a second known magnetic state having a magnetization parallel to the invariable magnetization direction of the reference layer by a magnetic resetting field with a predominant component parallel to the invariable magnetization direction of the reference layer when a setting electrical current pulse of predetermined magnitude, duration, and direction flows along the conductive set/reset line. After each setting the layer to the first magnetic state, the magnetization of the recording layer is configurable, or switchable, to the direction in accordance with a direction of a recording current through the bit line into the stacked body along the stack direction to act on the recording layer by a dual spin-transfer torque from the reference layer and the spin-valve layer. After each resetting the spin-valve layer to the second magnetic state, the magnetization of the recording layer becomes un-configurable, or un-switchable to a reading current through the bit line into the stacked body along the stack direction, since the reference layer and spin-valve layer have parallel magnetizations on the opposite sides of the recording layer and accordingly spin-transfer torques cancels or partially cancels.

Various embodiments will be described hereinafter with reference to the accompanying drawings. The drawings are schematic or conceptual, and the relationships between the thickness and width of portions, the proportional coefficients of sizes among portions, etc., are not necessarily the same as the actual values thereof.

DETAILED DESCRIPTION OF THE INVENTION

In general, according to each embodiment, there is provided a magnetoresistive element comprising:

a recording layer having magnetic anisotropy in a film surface and having a variable magnetization direction;

a reference layer having magnetic anisotropy in a film surface and having an invariable magnetization direction;

a tunnel barrier layer provided between the recording layer and the reference layer;

an intermediate layer provided on a surface of the recording layer, which is opposite to a surface of the recording layer where the tunnel barrier layer is provided;

a spin-valve layer provided on a surface of the intermediate layer having magnetic anisotropy in a film plane and having a variable magnetization direction;

an upper electrode provided as the top electric connecting layer of the magnetoresistive element;

and a bottom electrode provided as the bottom electric connecting layer of the magnetoresistive element.

In each embodiment, there is also provided a magnetoresistive memory cell comprising a magnetoresistive element and further comprising:

a bit line coupled to the plurality of magnetoresistive memory elements through the upper electrode; and a CMOS transistor coupled the plurality of magnetoresistive memory elements through the bottom electrode.

An exemplary embodiment further includes method of operating a spin-transfer torque magnetoresistive memory including a circuitry coupled to the bit line positioned adjacent to selected ones of the plurality of magnetoresistive memory elements and configured to either of two set/reset modes thereafter:

setting the spin-valve layer to a first known magnetic state having a magnetization anti-parallel to the invariable magnetization direction of the reference layer by a magnetic setting field with a predominant component anti-parallel to the invariable magnetization direction of the reference layer when a setting electrical current pulse of predetermined magnitude, duration, and direction flows along the bit line; and resetting the spin-valve layer to a second known magnetic state having a magnetization parallel to the invariable magnetization direction of the reference layer by a magnetic resetting field with a predominant component parallel to the invariable magnetization direction of the reference layer when a resetting electrical current pulse of predetermined magnitude, duration, and direction flows along the bit line.

After setting the spin-valve layer to the first magnetic state, the magnetization of the recording layer is configurable, or switchable, to the direction in accordance with a direction of a recording current through the bit line into the stacked body along the stack direction to act on the recording layer by a dual spin-transfer torque from the reference layer and the spin-valve layer.

After resetting the spin-valve layer to the second magnetic state, the magnetization of the recording layer becomes un-configurable, or un-switchable to a reading current through the bit line into the stacked body along the stack direction, since the reference layer and spin-valve layer have parallel magnetizations on the opposite sides of the recording layer and accordingly spin-transfer torques cancel or partially cancel.

Another exemplary embodiment further includes method of operating a spin-transfer torque magnetoresistive memory including a circuitry coupled to a conductive set/reset line positioned adjacent to selected ones of the plurality of magnetoresistive memory elements and configured to either of two set/reset modes thereafter:

setting the spin-valve layer to a first known magnetic state having a magnetization anti-parallel to the invariable magnetization direction of the reference layer by a magnetic setting field with a predominant component anti-parallel to the invariable magnetization direction of the reference layer when a setting electrical current of predetermined magnitude, duration, and direction flows along the conductive set/reset line; and resetting the spin-valve layer to a second known magnetic state having a magnetization parallel to the invariable magnetization direction of the reference layer by a magnetic resetting field with a predominant component parallel to the invariable magnetization direction of the reference layer when a resetting electrical current of predetermined magnitude, duration, and direction flows along the conductive set/reset.

After setting the spin-valve layer to the first magnetic state, the magnetization of the recording layer is configurable, or switchable, to the direction in accordance with a direction of a recording current through the bit line into the stacked body along the stack direction to act on the recording layer by a dual spin-transfer torque from the reference layer and the spin-valve layer.

After resetting the spin-valve layer to the second magnetic state, the magnetization of the recording layer becomes un-configurable, or un-switchable to a reading current through the bit line into the stacked body along the stack direction, since the reference layer and spin-valve layer have parallel magnetizations on the opposite sides of the recording layer and accordingly spin-transfer torques cancel or partially cancel.

The following detailed descriptions are merely illustrative in nature and are not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

First Embodiment

Figure 1:
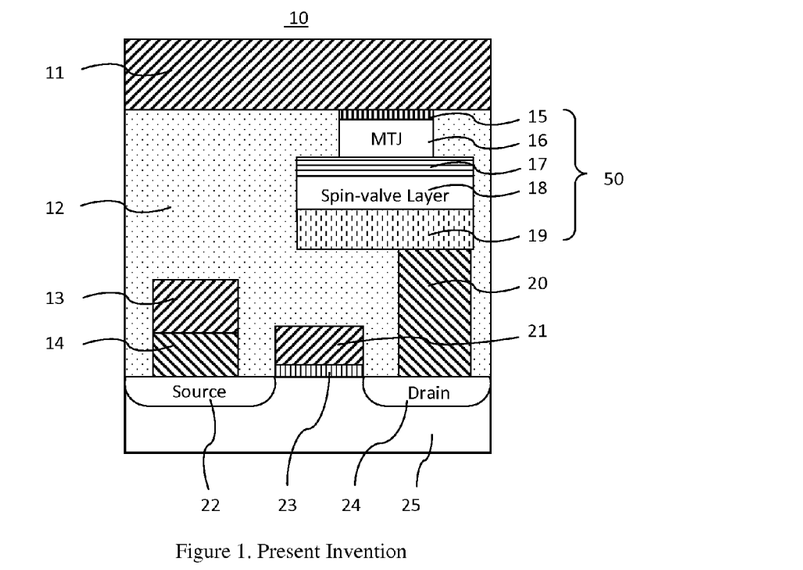
FIG. 1 is an exemplary cross-section of one memory cell in a planar STT-MRAM array according to the first embodiment.

FIG. 1 is an exemplary cross-section of a magnetoresistive memory cell 10 in a planar STT-MRAM array according to the first embodiment. The magnetoresistive memory cell 10 is configured by a bit line 11, a dielectric interlayer 12, a magnetoresistive element 50 and a MRAM bit/element/cell select transistor comprising a foundation layer that has (a) a MRAM bit/element/cell select transistor junction layer formed by a substrate 25, a source region 22 formed in the substrate 25, a drain region 24 formed in the substrate 25, and (b) a "gate and interconnect" layer that has an interconnect layer 13, a source contact 14, a drain contact 20, a gate insulating film, and a gate electrode 21. The magnetoresistive element 50 comprises: an upper electrode 15, an MTJ stack 16, an intermediate layer 17, a spin-valve layer 18 and a bottom electrode 19.

Figure 2A:
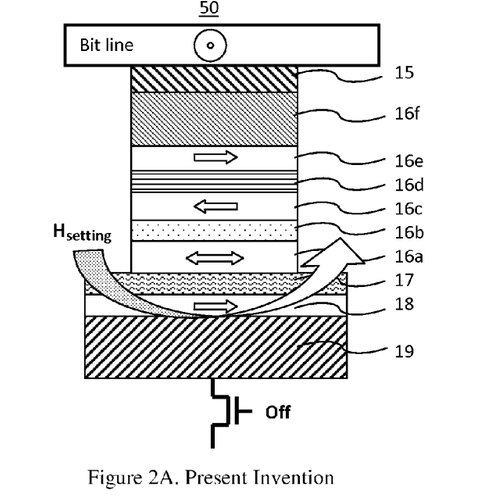
FIG. 2A illustrates a memory element having a bit line setting current pulse generated field to set the spin-valve layer magnetization anti-parallel to the reference layer magnetization, according to the first embodiment.

FIG. 2A illustrates a magnetoresistive element 50 setting into a recording mode by applying a bit line setting current pulse, according to the first embodiment. The magnetoresistive element 50 comprises: an upper electrode 15, an antiferromagnetic pinning layer 16f, a pinned ferromagnetic layer 16e, a coupling spacing layer 16d, a reference layer 16c, a tunnel barrier 16b, a recording layer 16a, an intermediate layer 17, a spin-valve layer 18 and a bottom electrode 19, in the order from the top. Among them, the multi-layered structure from 16a to 16f forms a MTJ stack.

The antiferromagnetic pinning layer 16f is above and in contact with the pinned magnetic layer 16e. The ferromagnetic reference layer and pinned magnetic layer (16c, 16e) each have a magnetic moment vector that are usually held anti-parallel by the coupling spacing layer 16d and held in a fixed direction by the antiferromagnetic pinning layer. Thus the magnetic moment vector of fixed reference layer 16c is not free to rotate and is used as a reference. The coupling spacing layer is typically one that exhibits the oscillatory coupling phenomenon, for example, at least one of the elements Ru, Os, Re, Cr, Rh, Cu, or their combinations, with a thickness chosen for strong anti-parallel coupling. The antiferromagnetic pinning layer, may comprise materials such as PtMn, IrMn, PdMn, or combinations thereof.

The recording layer 16a has a variable (reversible) magnetization having a uni-axial anisotropy parallel to the fixed magnetization of the reference layer. In another word, the MTJ stack is either at its parallel state (or the low resistance state) or anti-parallel state (or the high resistance) where no external magnetic field exists and no spin-transfer current is applied.

The spin-valve layer is made of ferromagnetic material, and has a variable (reversible) magnetization having an uniaxial anisotropy parallel to the fixed magnetization of the reference layer. The anisotropy of the spin-valve layer is smaller than that of the recording layer, which can be achieved by selecting a material having low Hc and near-zero magnetostriction and larger dimensions in the film plane, accordingly, its magnetization is readily field-switched by the bit line set/reset current pulse.

A permeable ferromagnetic material, also known also as a cladding material, may be positioned on a top portion of the bit line to focus the magnetic field on its underneath spin-valve layer. Further, the spin-valve layer easy axis may be oriented at an angle in the range of about 20 degrees to 45 degrees from the fixed magnetization direction of the reference. In a preferred embodiment of the invention, the free layer easy axis is oriented at an angle of about 90 degrees from the direction of the magnetic field generated by the bit line set/reset current pulse. It can be easily shown that for a typical free layer having a Stoner-Wohlfarth-like switching astroid, the switching field is reduced by a factor of 2 if the field is applied at 45 degrees from the easy axis of the bit. Therefore, the current needed to set or reset the spin-valve layer magnetization direction is also reduced by a factor of 2, making the set/reset require less power, while the magnetic vector of the free layer is un-switched in the present of the bit line set/reset current.

The intermediate layer 17 in FIG. 2 is made of a thin metal oxide, such as MgO, or the nonmagnetic metal, such as Cu, forming a thin tunneling magnetoresistance or giant magnetoresistance between the recording layer and the spin-valve layer. Accordingly, the recording layer magnetization experiences spin-transfer torques from both the reference layer and the spin-valve layer. Further, its magnetoresistance is made much smaller than that of the MTJ, yielding negligible effect on the reading signals.

The magnetic field generated by a setting current pulse along the bit line switches the spin-valve layer magnetization anti-parallel to the fixed magnetization of the reference layer. Since the shape anisotropy of the spin-valve layer is made much smaller than that of the recording layer, the setting field readily switches the spin-valve layer magnetization while the recording layer magnetization keeps unchanged. It is achieved by selecting the spin-valve layer having a near-zero magnetostriction material, a larger dimensions/volume. The spin-valve layer is readily switched by a field from bit line set/reset current due to its smaller anisotropy than the recording layer, but the much larger size provides an enough anisotropy energy as well as high thermal stability factor.

Figure 2B:
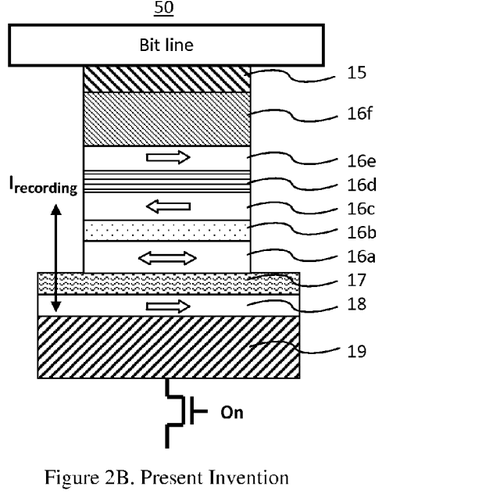
FIG. 2B illustrates a memory element in a recording mode after applying a bit line setting current pulse. The magnetization of the recording layer is switchable to the direction in accordance with a direction of a recording spin-transfer current through the bit line into the stacked body along the stack direction by a dual spin-transfer torque from the reference layer and the spin-valve layer.

FIG. 2B illustrates a magnetoresistive element 50 in a recording process having a spin-transfer current flowing between the bit line and the transistor, according to the first embodiment. Once a bit-line setting current pulse is applied, the magnetoresistive element is set in a recording mode, as shown FIG. 2B, the spin-valve layer has a magnetization anti-parallel to the magnetization direction of the reference layer, the magnetization of the recording layer is configurable, or switchable, to the direction in accordance with a direction of a recording current through the bit line into the stacked body along the stack direction to act on the recording layer. Since the magnetization directions between the spin-valve layer and the reference layer are anti-parallel, the spin transfer torques from both of them are additive, yielding a lower switching current. Thus, the recording current voltage is reduced and a larger margin between breakdown and switching voltages is obtained.

Figure 3A:
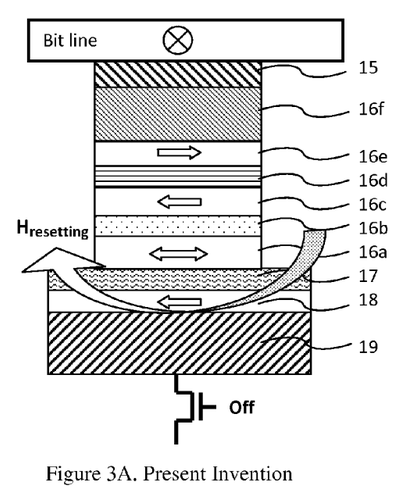
FIG. 3A illustrates a memory element having a bit line resetting current pulse generated field to set the spin-valve layer magnetization parallel to the reference layer magnetization, according to the first embodiment.
Figure 3B:
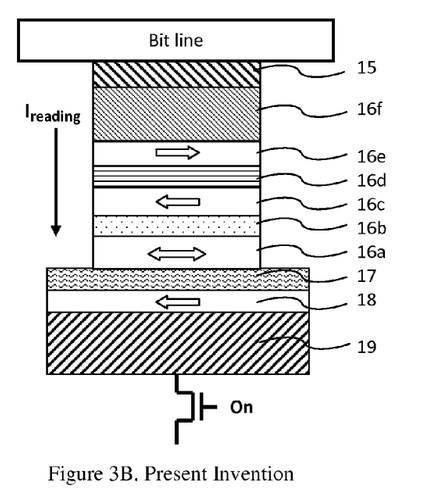
FIG. 3B illustrates a memory element in a reading mode after applying a bit line resetting current pulse. The MTJ resistance state is only read-out by a reading current through the bit line into the stacked body along the stack direction.

FIG. 3A illustrates a magnetoresistive element 50 having been reset into a reading mode by applying a bit line resetting current pulse, according to the first embodiment. The field generated by the bit line resetting current switches the spin-valve layer magnetization parallel to the fixed magnetization of the reference layer and the spin-valve layer. After a bit line resetting current pulse is applied, magnetoresistive element is set in a reading mode, as shown FIG. 3B, the magnetization of the recording layer becomes un-configurable, or un-switchable to a reading current through the bit line into the stacked body along the stack direction, due to a cancellation or partially cancellation of the two spin-transfer torques. Accordingly, the reading current voltage causes no unintended switching.

During fabrication of the MRAM array architecture, each succeeding layer is deposited or otherwise formed in sequence and each magnetoresistive element may be defined by selective deposition, photolithography processing, etching, etc. using any of the techniques known in the semiconductor industry. Typically the layers of the MTJ stack are formed by thin-film deposition techniques such as physical vapor deposition, including magnetron sputtering and ion beam deposition, or thermal evaporation. During deposition of at least a portion of the magnetoresistive element, a magnetic field is provided to set a preferred anisotropy easy-axis into the material (induced intrinsic anisotropy). In addition, the MTJ stack is typically annealed at elevated temperature while exposed to a magnetic field directed along the preferred anisotropy easy-axis to further set the intrinsic anisotropy direction and to set the pinning direction when an antiferromagnetic pinning layer is used. The provided magnetic field creates a preferred anisotropy easy-axis for a magnetic moment vector in the ferromagnetic materials. In addition to intrinsic anisotropy, memory elements patterned into a shape having aspect ratio greater than one will have a shape anisotropy, and the combination of this shape and the intrinsic anisotropy define an easy axis that is preferably parallel to a long axis of the memory element.

Referring now to FIGS. 4 through 9, a method of manufacturing a magnetoresistive element in an MRAM array according to the first embodiment is described. The magnetoresistive element to be manufactured by the manufacturing method according to this embodiment is the magnetoresistive element 10 of the first embodiment of FIG. 1.

Figure 4:
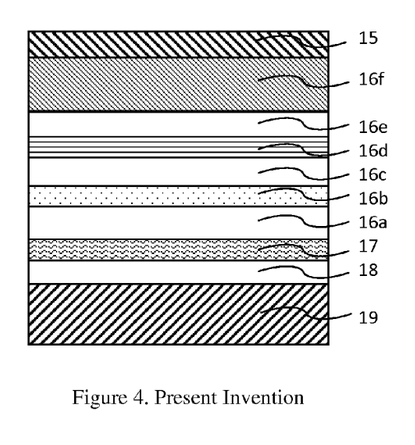
FIG. 4 is a cross-sectional view illustrating a manufacturing method according to the first embodiment.

First, as shown in FIG. 4, a magnetoresistive element including the bottom electrode 19, the spin-valve layer 18, the intermediate layer 17, recording layer 16a, the tunnel barrier layer 16b, the reference layer 16c, the coupling spacing layer 16d, the pinned magnetic layer 16e, the antiferromagnetic layer 16f, and the hard mask layer 15 serving as the upper electrode are then sequentially formed to cover the contact 20 (see FIG. 1) by a sputtering technique, for example. The bottom electrode 19 is a necessary base layer for connecting to the contact 20 and growing flat magnetic layers having good magnetization and high magnetoresistive ratio. Examples of the materials of the spin-valve layer 18, the recording layer 16a and reference layer 16c are materials made of ferromagnetic material alloy consisting at least one element from Co, Fe, Ni and B. The intermediate layer may be a nonmagnetic layer made of Cu, Ag, Au, or a thin metal oxide such as MgO, etc. The tunnel barrier layer 16b may be a magnesium oxide (MgO) layer, for example. The hard mask layer 15 may be a tantalum (Ta) layer, for example.

Figure 5:
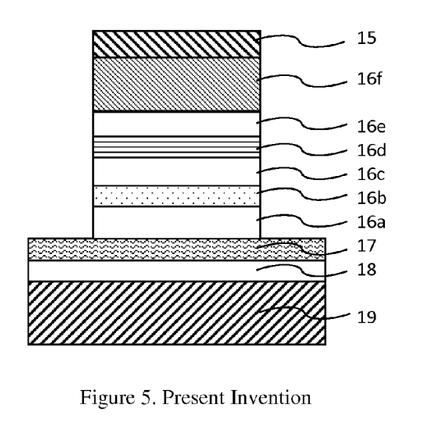
FIG. 5 is a cross-sectional view illustrating a manufacturing method according to the first embodiment.

An MTJ stack patterning is then performed by using a known lithography technique or a known etching technique. A mask (not shown) made of a photoresist is formed on the hard mask layer 15. Using the mask, patterning is performed on the hard mask layer 15 and down to a top surface of the intermediate layer 17 by anisotropic etching such as reactive ion etching (RIE), as shown in FIG. 5. Since possible re-deposition of metal atoms on the MTJ side wall could be formed, it's preferred to conduct a sputter etching at varied angle to remove these materials from tunnel barrier layer edges. It should be noted that any residual material from the recording layer may be further oxidized to avoid possible current crowding induced MTJ resistance variation. An optional process includes O ion or N ion implantation into the etched surface.

Figure 6:
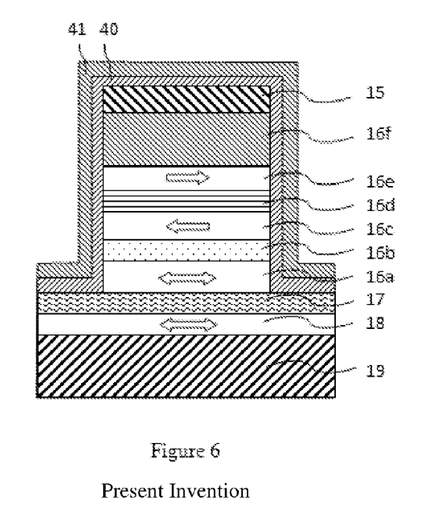
FIG. 6 is a cross-sectional view illustrating a manufacturing method according to the first embodiment.
Figure 7:
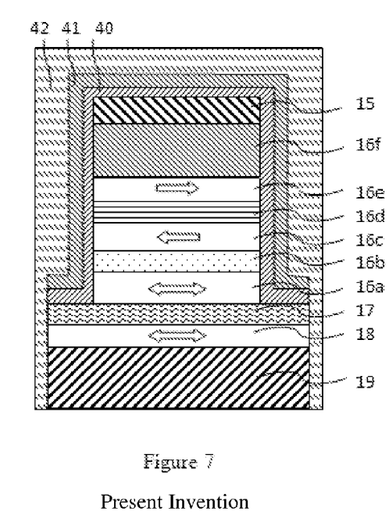
FIG. 7 is a cross-sectional view illustrating a manufacturing method according to the first embodiment.

A first insulating film (FIF) 40 is then formed to conformably cover the surface of the patterned film. After the first insulating film (FIF) 40 is formed, a second insulating film (SIF) 41 made of silicon oxide (SiO$_2$) or silicon nitride (SiN), for example, is deposited on the entire surface, as shown in FIG. 6. A mask (not shown) made of a photoresist, for example, is formed on the top surface of the (SIF) 41, to electrically separates the magnetoresistive element 10 from the adjacent memory cells. Using this mask, patterning is performed on the spin-valve layer (SVL) that has the intermediate layer (IL) 17, the spin-valve magnetic layer (SVML) 18, and the bottom electrode (BE) 19 by anisotropy etching. After that, a third insulating film (TIF) 42 is deposited to cover the patterned device in process for electrically insulating each MRAM bit/element/call from others, as shown in FIG. 7.

Figure 8:
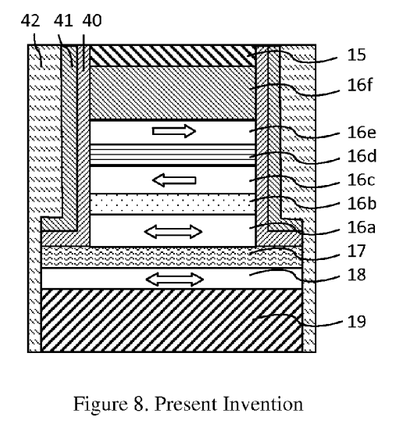
FIG. 8 is a cross-sectional view illustrating a manufacturing method according to the first embodiment.

The TIF 42 is then flattened by CMP. Further, the TIF 42, the SIF 41, and the FIF 40 are also trimmed, to expose the upper surface of the hard mask layer 15 on the MTJ layer, as shown in FIG. 8.

Figure 9:
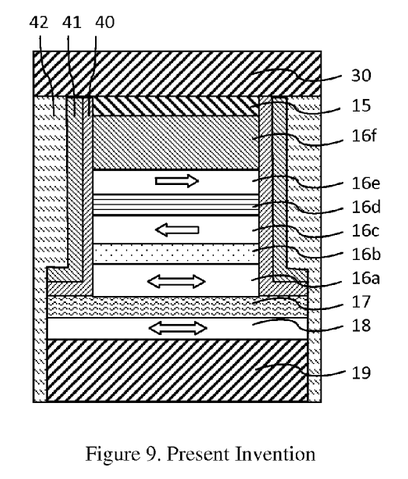
FIG. 9 is a cross-sectional view illustrating a manufacturing method according to the first embodiment.

As shown in FIG. 9, a bit line 30 to be electrically connected to the hard mask layer 15 is formed on the magnetoresistive element 10. The bit line 30 may be made of aluminum (Al) or copper (Cu), for example. Thus, a memory cell of the MRAM of the first embodiment is formed by the manufacturing method according to this embodiment.

In the MRAM manufactured by the manufacturing method according to this embodiment, the spin transfer switching characteristics of magnetoresistive elements used in memory cells can be improved due to a dual spin transfer torque effect. Further, the magnetoresistive elements are manufactured with a high yield as a separated programming between recording and reading enables enhanced margins among reading, recording and breakdown voltages. Accordingly, MRAMs manufactured by the manufacturing method according to this embodiment have high productivity.

According to this embodiment, an MRAM can be formed by using magnetoresistive elements according to one of the first embodiment and its modifications.

Figure 10:
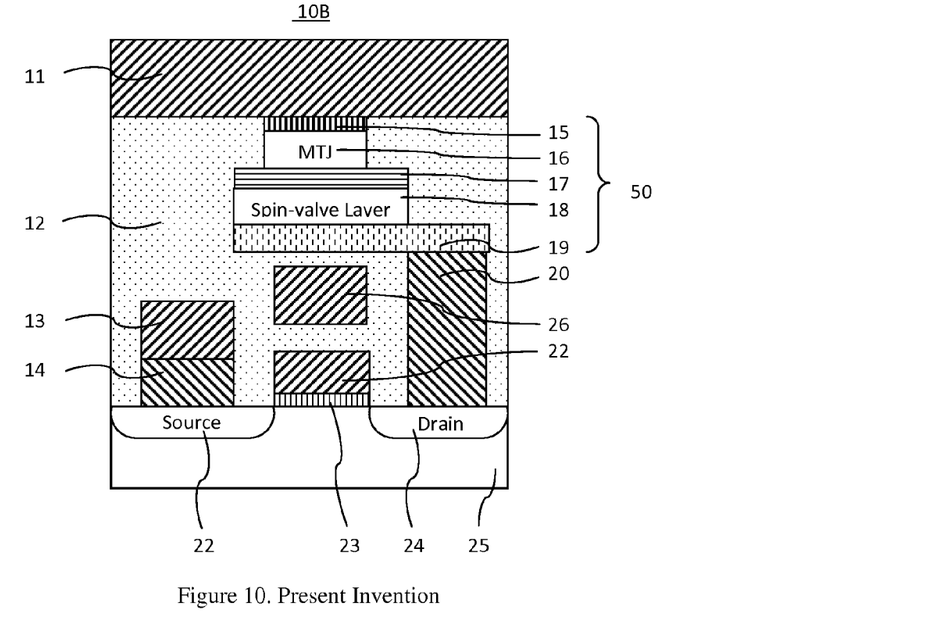
FIG. 10 is an exemplary cross-section of one memory cell in a planar STT-MRAM array according to a first modification of the first embodiment.

FIG. 10 shows a memory cell according to a first modification of the first embodiment. The magnetoresistive element 10B according to the second modification is the same as the magnetoresistive element 10 of the first embodiment shown in FIG. 1, except that an additional conductive set/reset layer 26 is provided.

Figure 11:
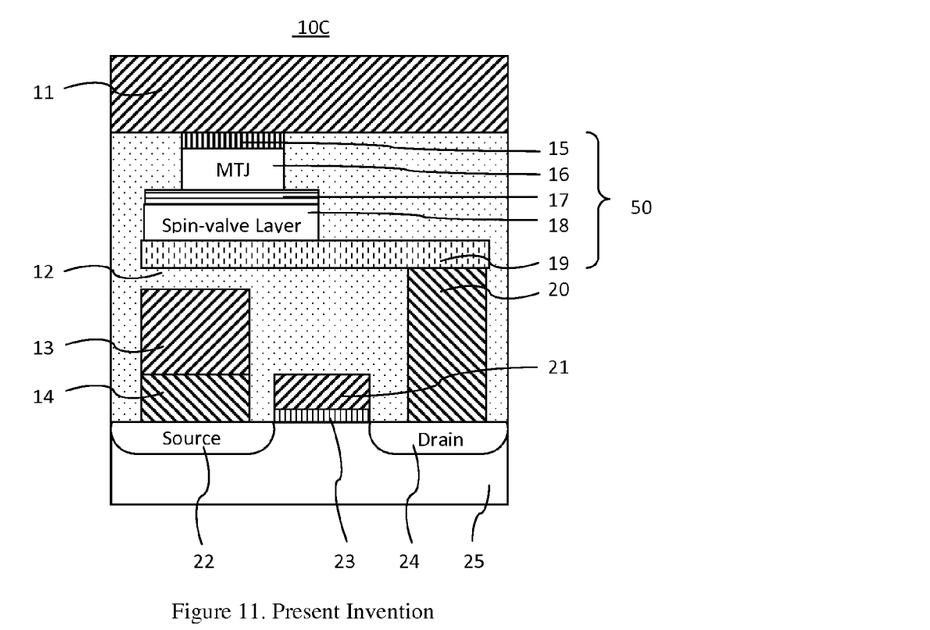
FIG. 11 is an exemplary cross-section of one memory cell in a planar STT-MRAM array according to a second modification of the first embodiment.

FIG. 11 shows a memory cell according to a second modification of the first embodiment. The magnetoresistive element 10C according to the second modification is the same as the magnetoresistive element 10 of the first embodiment shown in FIG. 1, except that the interconnect layer 13 serving as setting/resetting function instead of bit line setting/resetting.

Second Embodiment

Referring now to FIGS. 12-20, a magnetoresistive memory cell according to a second embodiment is described.

Figure 12:
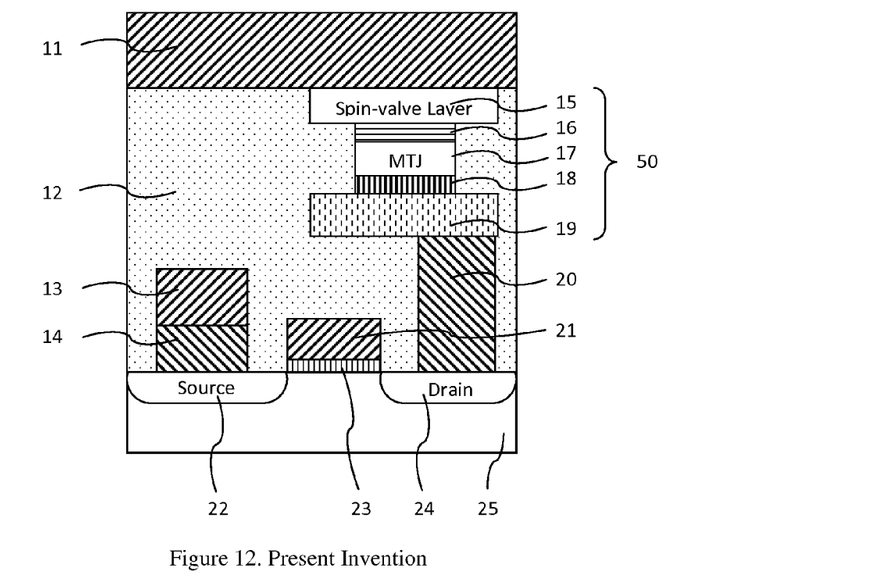
FIG. 12 is an exemplary cross-section of one memory cell in a planar STT-MRAM array according to the second embodiment.

FIG. 12 is an exemplary cross-section of a magnetoresistive memory cell 10 in a planar STT-MRAM array according to the second embodiment. The magnetoresistive memory cell 10 is configured by a bit line 11, a dielectric interlayer 12, a magnetoresistive element 50 and a MRAM bit/element/cell select transistor comprising a foundation layer that has (a) a MRAM bit/element/cell select transistor junction layer formed by a substrate 25, a source region 22 formed in the substrate 25, a drain region 24 formed in the substrate 25, and (b) a "gate and interconnect" layer that has an interconnect layer 13, a source contact 14, a drain contact 20, a gate insulating film, and a gate electrode 21. The magnetoresistive element 50 comprises: a spin-valve layer 15, an intermediate layer 16, an MTJ stack 17, a seed layer 18 and a bottom electrode 19.

Figure 13A:
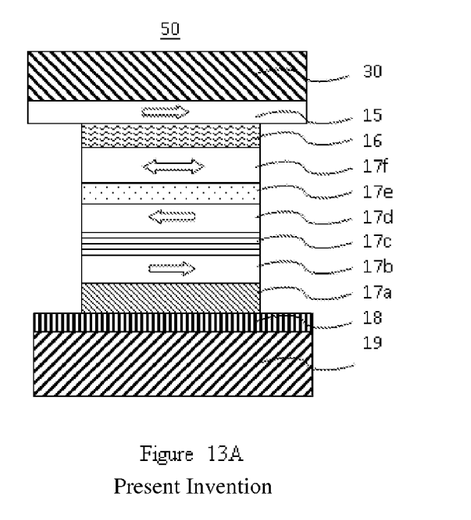
FIG. 13A illustrates a memory cell in a recording mode having anti-parallel magnetization states between the reference layer and the spin-valve layer after bit line current setting, according to the second embodiment.

The shape anisotropy of the spin-valve layer is along the same direction of the recording layer, but is much smaller than that of the recording layer so that the setting field readily switches the spin-valve layer magnetization while leaving the recording layer magnetization unchanged. It is achieved by selecting the spin-valve layer having a near-zero magnetostriction material, a larger dimensions/volume. The spin-valve layer is readily switched by a field from bit line set/reset current due to its smaller anisotropy than the recording layer, but the much larger size provides an enough anisotropy energy as well as high thermal stability factor. FIG. 13A illustrates a magnetoresistive element 50 setting into a recording mode by applying a bit line setting current pulse, according to the second embodiment. The field generated by the bit line setting current switches the spin-valve layer magnetization anti-parallel to the fixed magnetization of the reference layer and the spin-valve layer, accordingly, the spin transfer torques from both of them are additive, yielding a lower switching current. As a result, the margin between recording voltage and break-down voltage is improved.

The magnetoresistive element 50 comprises: an upper electrode 30, a spin-valve layer 15, an intermediate layer 16, a recording layer 17f, a tunnel barrier 17e, a reference layer 17d, a coupling spacing layer 17c, a pinned ferromagnetic layer 17b, antiferromagnetic pinning layer 17a, a seed layer 18 and a bottom electrode 19, in the order from the top. Among them, the multi-layered structure from 17a to 17f forms a MTJ stack.

The pinned magnetic layer 17b is above and in contact with the antiferromagnetic ferromagnetic layer 17a. The ferromagnetic reference layer and pinned magnetic layer (17d, 17b) each have a magnetic moment vector that are usually held anti-parallel by the coupling spacing layer 17c and held in a fixed direction by the antiferromagnetic pinning layer. Thus the magnetic moment vector of fixed reference layer 17d is not free to rotate and is used as a reference. The coupling spacing layer is typically one that exhibits the oscillatory coupling phenomenon, for example, at least one of the elements Ru, Os, Re, Cr, Rh, Cu, or their combinations, with a thickness chosen for strong anti-parallel coupling. The antiferromagnetic pinning layer, may comprise materials such as PtMn, IrMn, PdMn, or combinations thereof.

The recording layer 17f has a variable (reversible) magnetization having a uni-axial anisotropy parallel to the fixed magnetization of the reference layer. In another word, the MTJ stack is either at its parallel state (or the low resistance state) or anti-parallel state (or the high resistance) where no external magnetic field exists and no spin-transfer current is applied.

The spin-valve layer is made of ferromagnetic material, and has a variable (reversible) magnetization having a uniaxial anisotropy parallel to the fixed magnetization of the reference layer. The anisotropy of the spin-valve layer is smaller than that of the recording layer, which can be achieved by selecting a material having low Hc and near-zero magnetostriction and larger dimensions in the film plane, accordingly, its magnetization is readily field-switched by the bit line set/reset current pulse.

A permeable ferromagnetic material, also known also as a cladding material, may be positioned on a top portion of the bit line to focus the magnetic field on its underneath spin-valve layer. Further, the spin-valve layer easy axis may be oriented at an angle in the range of about 20 degrees to 45 degrees from the fixed magnetization direction of the reference. In a preferred embodiment of the invention, the free layer easy axis is oriented at an angle of about 90 degrees from the direction of the magnetic field generated by the bit line set/reset current pulse. It can be easily shown that for a typical free layer having a Stoner-Wohlfarth-like switching astroid, the switching field is reduced by a factor of 2 if the field is applied at 45 degrees from the easy axis of the bit. Therefore, the current needed to set or reset the spin-valve layer magnetization direction is also reduced by a factor of 2, making the set/reset require less power, while the magnetic vector of the free layer is un-switched in the present of the bit line set/reset current.

The intermediate layer is made of a thin metal oxide, such as MgO, or the nonmagnetic metal, such as Cu, forming a thin tunneling magnetoresistance or giant magnetoresistance between the recording layer and the spin-valve layer. Accordingly, the recording layer magnetization experiences spin-transfer torques from both the reference layer and the spin-valve layer. Further, the magnetoresistance is made much smaller than that of the MTJ, yielding negligible effect on the reading signals.

Once a bit-line setting current pulse is applied, the magnetoresistive element is set in a recording mode, as shown FIG. 13A, the spin-valve layer has a magnetization anti-parallel to the magnetization direction of the reference layer, the magnetization of the recording layer is configurable, or switchable, to the direction in accordance with a direction of a recording current through the bit line into the stacked body along the stack direction to act on the recording layer by a dual spin-transfer torque from the reference layer and the spin-valve layer. Thus, the recording current voltage is reduced and a larger margin between breakdown and switching voltages is obtained.

Figure 13B:
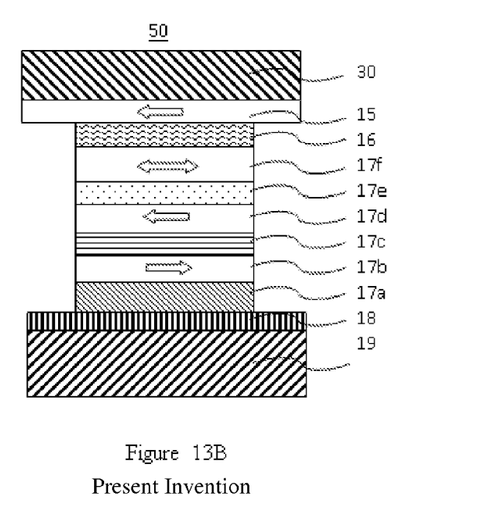
FIG. 13B illustrates a memory cell in a reading mode having parallel magnetization states between the reference layer and the spin-valve layer after bit line current resetting, according to the second embodiment.

FIG. 13B illustrates a magnetoresistive element 50 having been reset into a reading mode by applying a bit line resetting current pulse, according to the first embodiment. The field generated by the bit line resetting current switches the spin-valve layer magnetization parallel to the fixed magnetization of the reference layer and the spin-valve layer, accordingly, the magnetization of the recording layer becomes un-configurable, or un-switchable to a reading current through the bit line into the stacked body along the stack direction, due to a cancellation or partially cancellation of the two spin-transfer torques. Accordingly, the reading current voltage causes no unintended switching.

Referring now to FIGS. 14 through 20, a method of manufacturing a magnetoresistive element in an MRAM array according to the second embodiment is described. The magnetoresistive element to be manufactured by the manufacturing method according to this embodiment is the magnetoresistive element 10 of the first embodiment of FIG. 12.

Figure 14:
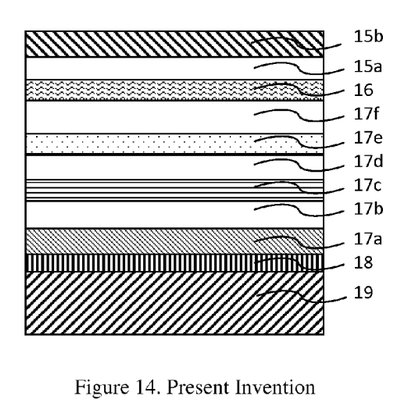
FIG. 14 is a cross-sectional view illustrating a manufacturing method according to the second embodiment.

First, as shown in FIG. 14, a magnetoresistive element including the bottom electrode 19, the seed layer 18, the antiferromagnetic layer 17a, the pinned magnetic layer 17b, the coupling spacing layer 17c, the reference layer 17d, the tunnel barrier layer 17e, the recording layer 17f, the intermediate layer 16, spin-valve layer 15a and the hard mask layer 15b is then sequentially formed to cover the contact 20 (see FIG. 12) by a sputtering technique, for example. Examples of the materials of the spin-valve layer 15a, the recording layer 17f and reference layer 17d are materials made of ferromagnetic material alloy consisting Co, Fe, Ni and B. The intermediate layer may be a nonmagnetic layer made of Cu, Ag, Au, or a thin metal oxide such as MgO, etc. The tunnel barrier layer 17e may be a magnesium oxide (MgO) layer, for example. The hard mask layer 15b may be a Ru/Ta (top) layer, for example.

Figure 15:
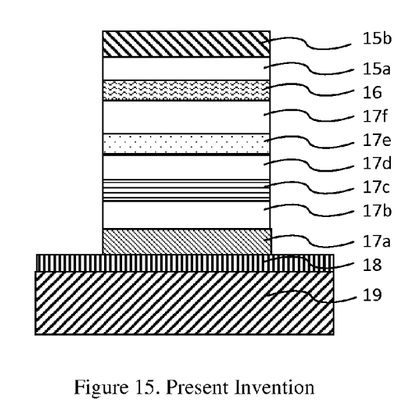
FIG. 15 is a cross-sectional view illustrating a manufacturing method according to the second embodiment.

An MTJ stack patterning is then performed by using a known lithography technique or a known etching technique. A mask (not shown) made of a photoresist is formed on the hard mask layer 15b. Using the mask, patterning is performed on the hard mask layer 15b and down to a top surface of the seed layer 18 by anisotropic etching, such as reactive ion etching (RIE), as shown in FIG. 15. Since possible re-deposition of metal atoms on the MTJ side wall could be formed, it's preferred to conduct a sputter etching at varied angle to remove these materials from tunnel barrier layer edges. An optional process includes O ion or N ion implantation into the etched surface.

Figure 16:
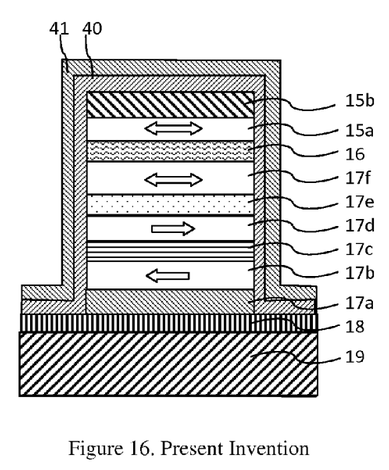
FIG. 16 is a cross-sectional view illustrating a manufacturing method according to the second embodiment.
Figure 17:
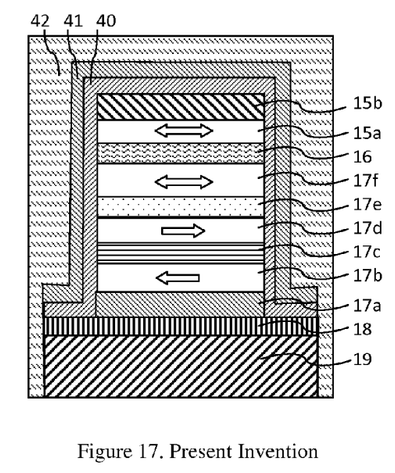
FIG. 17 is a cross-sectional view illustrating a manufacturing method according to the second embodiment.

A thin insulating film 40 is then formed to cover the surface of the patterned film. After the insulating film 40 is formed, an interlayer insulating film 41 made of silicon oxide ($SiO_2$) or silicon nitride (SiN), for example, is deposited on the entire surface, as shown in FIG. 16. A mask (not shown) made of a photoresist, for example, is formed on the flattened upper face of the interlayer insulating film 41, to electrically separates the magnetoresistive element 10 from the adjacent memory cells. Using this mask, patterning is performed on the seed layer 18 and the bottom electrode 19 by anisotropy etching. After that, an interlayer insulating film 42 is deposited to cover the interlayer insulating film 41, the insulating film 40, the bottom electrode 19, the seed layer 18 which have been subjected to the patterning, as shown in FIG. 17.

Figure 18:
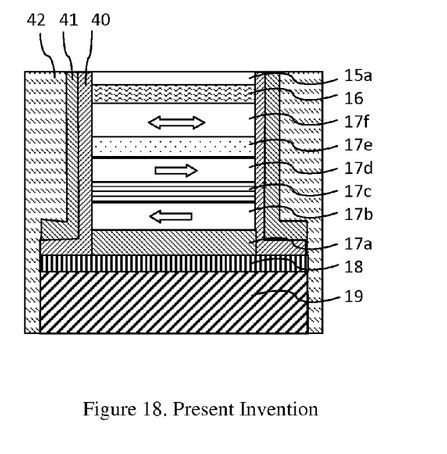
FIG. 18 is a cross-sectional view illustrating a manufacturing method according to the second embodiment.

The upper face of the interlayer insulating film 41 is then flattened by chemical mechanical polishing (CMP), followed by an IBE etching to remove the hard mask layer 15b and top portion of the spin-valve layer, as shown in FIG. 18.

Figure 19:
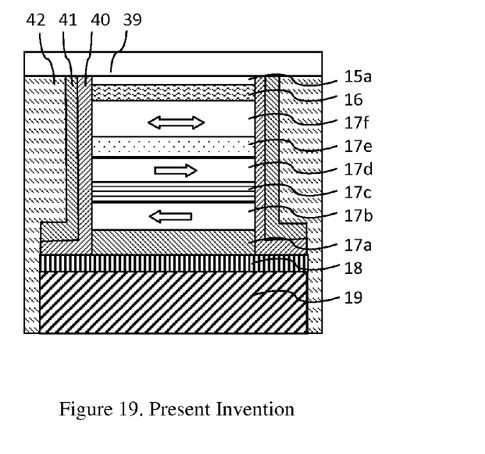
FIG. 19 is a cross-sectional view illustrating a manufacturing method according to the second embodiment.

A ferromagnetic film 39 is then deposited and combined with the remaining spin-valve layer having ferromagnetic contact to form a new spin-valve layer. The new spin-valve layer is further patterned into a shape having larger dimension than MTJ stack and aspect ratio greater than one, and this shape anisotropy mainly defines an easy axis parallel to a long axis of the spin-valve layer, as shown in FIG. 19.

Figure 20:
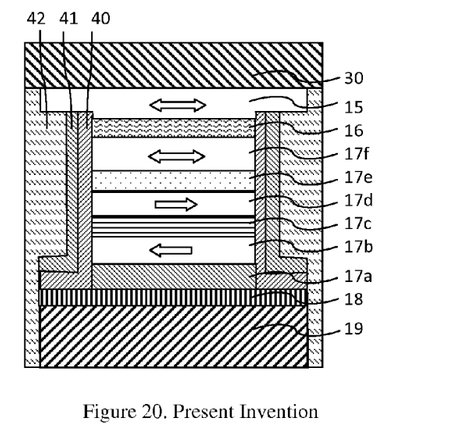
FIG. 20 is a cross-sectional view illustrating a manufacturing method according to the second embodiment.

As shown in FIG. 20, a bit line 30 to be electrically connected to the new spin-valve layer 15 on the magnetoresistive element 10. The bit line 30 may be made of aluminum (Al) or copper (Cu), for example. Thus, a memory cell of the MRAM of the first embodiment is formed by the manufacturing method according to this embodiment.

In the MRAM manufactured by the manufacturing method according to this embodiment, the spin transfer switching characteristics of magnetoresistive elements used in memory cells can be improved due to a dual spin transfer torque effect. Further, the magnetoresistive elements are manufactured with a high yield as a separated programming between recording and reading enables enhanced margins among reading, recording and breakdown voltages. Accordingly, MRAMs manufactured by the manufacturing method according to this embodiment have high productivity.

According to this embodiment, an MRAM can be formed by using magnetoresistive elements according to one of the first embodiment and its modifications.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. Method of making a spin-transfer torques magnetoresistive random access memory (STT-MRAM) comprising:

forming a foundation layer (FL);
forming a stack film atop the FL, comprising:
    forming a spin-valve layer (SVL) comprising an intermediate layer (IL) and a bottom electrode (BE) atop the FL;
    forming a magnetic tunnel junction (MTJ) layer (MTJL) atop the SVL;
    forming a coupling spacing layer (CSL) atop the MTJL;
    forming a pinned magnetic layer (PML) atop the CSL;
    forming an antiferromagnetic pinning layer (APL) atop the PML;
forming a hard mask layer (HML) atop the stack film, wherein the HML also serves as at least a portion of an upper electrode;
performing patterning on the HML;
etching from the patterned HML down to the top surface of the IL;
oxidizing residual material of a recording layer of the MTJL that is exposed by the patterned HML;
forming a first insulating film (FIF) covering the patterned surface of the device in process;
forming a second insulating film (SIF) covering the FIF, wherein the SIF preferably comprises one or more of material(s) silicon oxide ($SiO_2$) and silicon nitride SiN patterning the SIF and the SVL;
forming a third insulating film (TIF), optionally, on the surface of the patterned device in process for insulating each MRAM bit/element/cell;
performing a chemical mechanical polishing (CMP) process to flatten the upper surface of the TIF or the SIF, whichever is on the top;
forming a hard mask layer (HML) atop the surface of the device in process after CMP;
performing patterning on the HML;
etching from the patterned HML down through the BE to form a shape having aspect ratio greater than one and to insulate each MRAM bit/element/cell from others;
performing a CMP process to expose the top surface of the upper electrode; and
forming a bit line comprising forming an electrical conducting line comprising one or more of metal(s) preferably one or more of Al, Cu, Al alloy(s), and Cu alloy(s), to be connected to the upper electrode.

2. The method of claim 1, forming the FL comprising forming a substrate layer followed by forming a source region, drain region, and a junction region between the source region and the drain region in the substrate, whereby forming a junction layer of a bit select transistor; and forming a gate and interconnect layer, atop the junction layer, comprising
    a gate insulating film atop the junction region;
    a gate electrode atop the gate insulating film;
    an interconnect between the drain of the bit select transistor and the bottom electrode of the SVL;
    an interconnect atop the source of the bit select transistor; and
    an interconnect atop the gate of the bit select transistor.

3. The method of claim 1, forming the SVL comprising
forming a bottom electrode (BE), atop the FL;
forming a spin-valve magnetic layer (SVML) atop the BE, having a magnetic anisotropy with a variable magnetization direction parallel with a foundation layer (FL) surface plane (FLSP); and
forming the intermediate layer (IL) atop the SVML.

4. The method of claim 3, forming the IL comprising forming a nonmagnetic layer preferably comprising one or more of element(s)/material(s) Cu, Ag, Au, and a metal oxide preferably MgO.

5. The method of claim 1, forming the MTJL comprising
forming a recording layer having a magnetic anisotropy with a variable magnetization direction parallel with the FLSP, atop the IL;
forming a tunnel barrier layer atop the recording layer; and
forming a reference layer atop the tunnel barrier layer, having a magnetic anisotropy with a fixed magnetization direction parallel with the FLSP, wherein the magnetization direction of the recording layer spins between the magnetization direction of the reference layer and its opposite direction.

6. The method of claim 1, forming the CSL comprising forming a layer comprising one or more of element(s) Ru, Os, Re, Cr, Rh, and Cu, with a suitable thickness for achieving a sufficient anti-parallel coupling capability.

7. The method of claim 1, forming the PML comprising forming a ferromagnetic alloy layer preferably a CoFe layer.

8. The method of claim 1, forming the APL comprising forming a magnetic layer with a magnetization direction opposite to that of PML preferably comprising one or more of material(s) PtMn, IrMn, and PdMn, whereby helping to pin the PML with a magnetization direction opposite to that of the reference layer of the MTJL.

9. The method of claim 1, forming the HML comprising forming a heavy metal layer preferably comprising one or more of element(s) Ta and ones with similar characteristics to that of Ta.

10. Method of making a spin-transfer torques magnetoresistive random access memory (STT-MRAM) comprising:
forming a foundation layer (FL);
forming a stack film atop the FL, comprising:
   forming a bottom electrode (BE) atop the FL;
   forming a seed layer (SL) atop the BE;
   forming an anti-ferromagnetic pinning layer (APL) atop the SL;
   forming a pinned magnetic layer (PML) atop the APL;
   forming a coupling spacing layer (CSL) atop the PML;
   forming a magnetic tunnel junction (MTJ) layer (MTJL) atop the CSL;
   forming a first spin-valve layer (FSVL) atop the MTJL;
forming a first hard mask layer (FHML) atop the stack film;
performing patterning on the FHML;
etching from the patterned FHML down to the top surface of the SL;
forming a first insulating film (FIF) covering the patterned surface of the device in process;
forming a second insulating layer (SIF), wherein the SIF preferably comprises one or more of material(s) silicon oxide (SiO$_2$) and silicon nitride (SiN), covering the FIF;
performing a chemical mechanical polishing (CMP) process to flatten the upper surface of the SIF;
forming a second hard mask layer (SHML) on the upper surface of the SIF after CMP;
performing patterning on the SHML;
etching from the patterned SHML down through the BE to insulate each MRAM bit/element/cell from others;
performing a CMP process to expose the top surface of the SHML;
performing an etching process to remove the SHML and a top portion of the FSVL;
forming a second spin-valve layer (SSVL) atop the remained portion of the FSVL from the etching process;
forming a third hard mask layer (THML) atop the SSVL;
performing patterning on the THML;
etching from the patterned THML down to the SSVL to form a shape having aspect ratio greater than one;
performing a third insulating film deposition on the areas that are exposed by the patterning process; and
forming a bit line comprising forming an electrical conducting line comprising one or more of metal(s) preferably one or more of Al, Cu, Al alloy(s), and Cu alloy(s), to be connected to the SSVL.

11. The method of claim 10, forming the APL comprising forming a magnetic layer preferably comprising one or more of material(s) PtMn, IrMn, and PdMn, whereby helping to magnetically pin the PML.

12. The method of claim 10, forming the PML comprising forming a ferromagnetic alloy layer preferably a CoFe layer, with a magnetization direction opposite to that of the reference layer of the MTJL.

13. The method of claim 10, forming the CSL comprising forming a layer comprising one or more of element(s) Ru, Os, Re, Cr, Rh, and Cu, with a suitable thickness for achieving a sufficient anti-parallel coupling capability.

14. The method of claim 10, forming the MTJL comprising
forming a reference layer having a fixed magnetization direction opposite to that of the PML atop the CSL;
forming a tunnel barrier layer atop the reference layer; and
forming a recording layer having a variable magnetization direction in a film plane atop the tunnel barrier layer,
wherein the magnetization direction of the recording layer may spin between the magnetization direction of the reference layer and the opposite of that upon an MRAM write current.

15. The method of claim 10, forming the FSVL comprising
forming an intermediate layer (IL) atop the MTJL; and
forming a spin-valve magnetic layer (SVML) atop the IL, having a variable magnetization direction parallel with the FLSP,
wherein the magnetization direction of the FSVL may spin between the magnetization direction of the reference layer and the opposite of that upon a spin-valve write current with up to 45 degree variation of the angle between the easy axis of the SSVL and the easy axis of the reference layer.

16. The method of claim 15, forming the IL comprising forming a nonmagnetic layer preferably comprising one or more of element(s) Cu, Ag, Au, and a metal oxide such as MgO.

17. The method of claim 10, forming the FHML comprising forming a heavy metal layer preferably comprising one or more of element(s) Ta and ones with similar characteristics to that of Ta.

18. The method of claim 10, forming the SSVL comprising forming a spin-valve magnetic layer (SVML) atop the remained FSVL after the etching process, having a variable magnetization direction parallel with the FLSP, wherein the magnetization direction of the SSVL may spin between the magnetization direction of the reference layer and the opposite of that upon a spin-valve write current with up to 45 degree variation of the angle between the easy axis of the SSVL and the easy axis of the reference layer.

* * * * *